United States Patent
Ni et al.

(10) Patent No.: US 12,469,774 B2
(45) Date of Patent: Nov. 11, 2025

(54) ELECTRONIC PACKAGE AND SUBSTRATE STRUCTURE THEREOF

(71) Applicant: SILICONWARE PRECISION INDUSTRIES CO., LTD., Taichung (TW)

(72) Inventors: Yuan-Chang Ni, Taichung (TW); Yu-Cheng Pai, Taichung (TW); Yuan-Ping Yeh, Taichung (TW); Chan-Yu Yeh, Taichung (TW); Meng-Jou He, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 383 days.

(21) Appl. No.: 18/351,770

(22) Filed: Jul. 13, 2023

(65) Prior Publication Data
US 2024/0332149 A1    Oct. 3, 2024

(30) Foreign Application Priority Data
Mar. 27, 2023    (TW) .................... 112111547

(51) Int. Cl.
*H01L 23/498*    (2006.01)
*H01L 23/00*    (2006.01)
*H01L 23/31*    (2006.01)

(52) U.S. Cl.
CPC .... *H01L 23/49822* (2013.01); *H01L 23/3121* (2013.01); *H01L 24/16* (2013.01); *H01L 2224/16227* (2013.01)

(58) Field of Classification Search
CPC .................... H01L 23/49822; H01L 23/49894
See application file for complete search history.

(56) References Cited

U.S. PATENT DOCUMENTS

| | | | |
|---|---|---|---|
| 2009/0085192 A1* | 4/2009 | Hsu ........................ | H05K 1/185 438/118 |
| 2009/0134515 A1* | 5/2009 | Hu ........................ | H01L 21/563 257/737 |
| 2018/0240745 A1* | 8/2018 | Lee .................... | H01L 23/49811 |
| 2023/0420355 A1* | 12/2023 | Oh .......................... | H01L 24/16 |

FOREIGN PATENT DOCUMENTS

TW    I332696 B    * 11/2010

OTHER PUBLICATIONS

Machine translation of TW-I332696-B (Year: 1999).*

* cited by examiner

*Primary Examiner* — Yu Chen
(74) *Attorney, Agent, or Firm* — Studebaker Brackett PLLC

(57) ABSTRACT

An electronic package and a substrate structure thereof are provided, in which a circuit layer and a filling layer are formed on a substrate body in the substrate structure, where the circuit layer has a plurality of conductive traces separated from each other, so that the filling layer is filled between the plurality of conductive traces, and a portion of a surface of the circuit layer and a surface of the filling layer are covered with an insulating protective layer. Therefore, the insulating protective layer is carried by the filling layer, so that the insulating protective layer can be thin, thereby preventing the phenomenon of copper migration from occurring to the substrate structure in subsequent processes.

9 Claims, 4 Drawing Sheets

ELECTRONIC PACKAGE AND SUBSTRATE STRUCTURE THEREOF

BACKGROUND

1. Technical Field

The present disclosure relates to a semiconductor packaging technology, and more particularly, to an electronic package and a substrate structure thereof.

2. Description of Related Art

As the dimensions of semiconductor products are gradually reducing, the circuit pitches in semiconductor packages are getting smaller according to requirements. For this reason, circuits are designed using a bump on lead/bump on trace (BOL/BOT) in the packaging substrate.

However, the pitch of the circuit designed using the BOL/BOT is extremely small, so a solder-mask layer acting as an electrical barrier cannot be formed between each circuit. Therefore, an opening that can expose multiple BOL/BOT circuits at the same time is usually formed on the entire solder-mask layer by an opening process.

As shown in FIG. 1A, in a conventional packaging substrate 1 using the BOL/BOT, a circuit layer 13 is formed on an outer surface 10a of a substrate body 10. The circuit layer 13 has a plurality of conductive traces 130 and a plurality of electrical contact pads 131 integrated with the plurality of conductive traces 130, and a solder-mask layer 11 is formed on the substrate body 10, wherein the solder-mask layer 11 has an opening 110 corresponding to all the electrical contact pads 131, so that the upper and side surfaces of the plurality of electrical contact pads 131 are completely exposed from the opening 110.

In the conventional packaging substrate 1, the opening process is carried out by exposure and development. In order to enhance the structural strength and to prevent the circuit layer 13 from being exposed to the risk of short circuit, a thickness h of the solder-mask layer 11 is designed to be much greater than a thickness t of the circuit layer 13 (e.g., a margin/difference e shown in FIG. 1C). Thus, in order to ensure the precision of the target area of an exposed surface 13a (copper material) of the circuit layer 13 (as shown in FIG. 1C), light energy F in the exposure and development operation will take the exposed surface 13a of the circuit layer 13 as the reference, that is, the light energy F will only act on the exposed surface 13a of the circuit layer 13, thereby the light energy F will not easily act on the bottom of the solder-mask layer 11 (i.e., the outer surface 10a of the substrate body 10). After the development operation, the bottom of the wall of the opening 110 of the solder-mask layer 11 is easily to be corroded by the development solution due to insufficient light, thereby forming an undercut structure V (as shown in FIG. 1B).

However, based on the requirements for fine circuit pitches, the pitches between the conductive traces 130 are getting smaller, and because of the undercut structure V, the packaging colloid cannot be filled into the undercut structure V in the subsequent packaging stage since the thickness h of the solder-mask layer 11 is designed to be much greater than the thickness of the circuit layer 13, so that the copper material of the conductive traces 130 may undergo copper migration phenomenon due to electron movement, and an irregular conductor 9 will be formed at the undercut structure V, such that the conductor 9 may connect two adjacent ones of the conductive traces 130 and cause an electrical short circuit.

Besides, although increasing the light energy F can reduce the probability of forming the undercut structure V at the bottom of the solder-mask layer 11, if the light energy F is too large, the solder-mask material on the circuit layer 13 will be overexposed, so the solder-mask material on the circuit layer 13 will be hard to remove after the development operation, resulting in too small area of the exposed surface 13a of the circuit layer 13, such that the circuit layer 13 cannot be effectively connected to other electronic components in the subsequent packaging process, and the problem of poor electrical transmission may even occur.

Therefore, how to overcome the problems of the above-mentioned prior art has become an urgent problem to be solved at present.

SUMMARY

In view of the aforementioned shortcomings of the prior art, the present disclosure provides a substrate structure, which comprises: a substrate body having a packaging surface; a circuit layer formed on the packaging surface, wherein the circuit layer comprises a plurality of conductive traces and a plurality of electrical contact pads bonded to the plurality of conductive traces, and the plurality of conductive traces are separated from each other; a filling layer formed on the packaging surface and disposed between the plurality of conductive traces, wherein the circuit layer is free from being covered by the filling layer; and an insulating protective layer formed on a surface of the filling layer and a portion of a surface of the circuit layer, wherein the insulating protective layer has at least one opening exposing the plurality of electrical contact pads.

In the aforementioned substrate structure, the filling layer is adjacent to the plurality of conductive traces.

In the aforementioned substrate structure, the filling layer has a thickness less than or equal to a thickness of the circuit layer.

In the aforementioned substrate structure, a portion of the packaging surface of the substrate body, portions of line sections of the plurality of conductive traces, and the plurality of electrical contact pads are exposed from the opening.

In the aforementioned substrate structure, a wall of the opening of the insulating protective layer and a top of the filling layer form a step-shaped structure.

In the aforementioned substrate structure, a material of the filling layer and a material of the insulating protective layer are the same.

In the aforementioned substrate structure, a material of the filling layer and a material of the insulating protective layer are different.

The present disclosure also provides an electronic package, which comprises: the aforementioned substrate structure; and an electronic component disposed on the packaging surface and electrically connected to the circuit layer.

In the aforementioned electronic package, the present disclosure further comprises a plurality of conductive components formed on the plurality of electrical contact pads in the opening, wherein the substrate structure is connected to the electronic component via the plurality of conductive components.

In the aforementioned electronic package, the present disclosure further comprises an encapsulation layer covering the electronic component.

It can be seen from the above that in the electronic package and the substrate structure thereof of the present disclosure, the design of the filling layer allows the insulating protective layer to be thin, so an undercut structure will not be formed at the bottom of the insulating protective layer. Therefore, compared with the prior art, the phenomenon of copper migration can be effectively prevented from occurring to the substrate structure of the present disclosure, so there is no short circuit between the adjacent conductive traces, thereby improving the reliability of the substrate structure of the present disclosure.

DETAILED DESCRIPTION

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "first," "second," "a," "one," and the like are merely used for clear explanation rather than limiting the practicable scope of the present disclosure, and thus, alterations or adjustments of the relative relationships thereof without essentially altering the technical contents should still be considered in the practicable scope of the present disclosure.

Figure 1A:
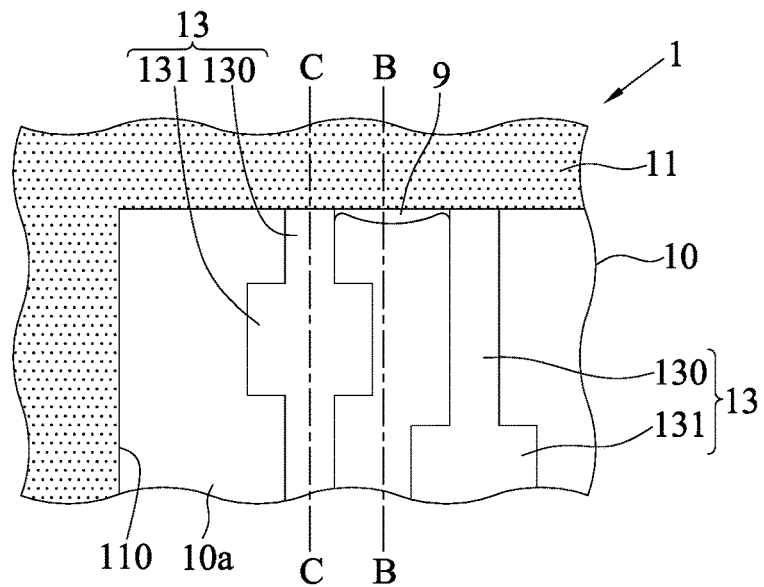
FIG. 1A is a schematic partial top plan view showing a conventional packaging substrate.
Figure 1B:
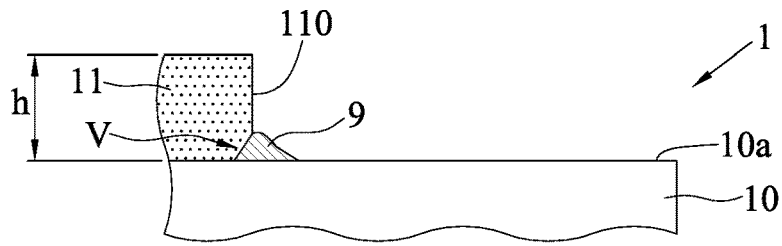
FIG. 1B is a cross-sectional view of a section line B-B in FIG. 1A.
Figure 1C:
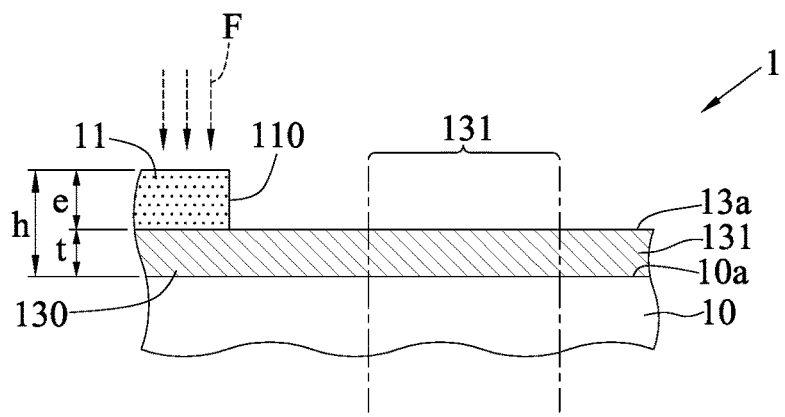
FIG. 1C is a cross-sectional view of a section line C-C in FIG. 1A.
Figure 2A:
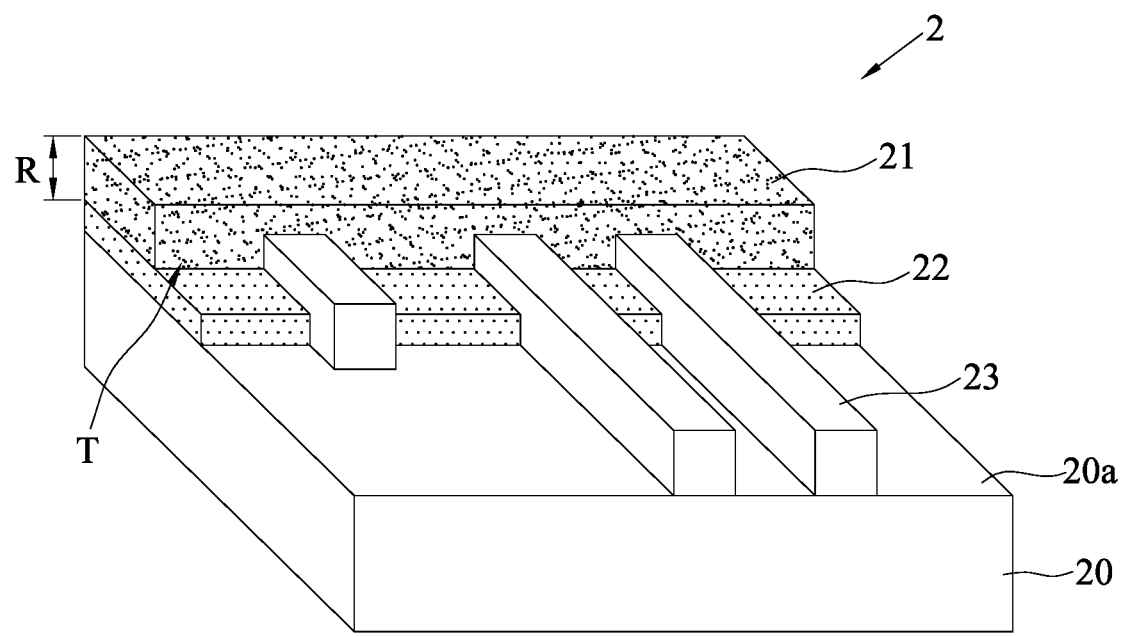
FIG. 2A is a schematic perspective view showing a substrate structure of the present disclosure.

FIG. 2A is a schematic perspective view showing a substrate structure 2 of the present disclosure. As shown in FIG. 2A, the substrate structure 2 comprises a substrate body 20, a circuit layer 23, a filling layer 22, and an insulating protective layer 21.

Figure 3:
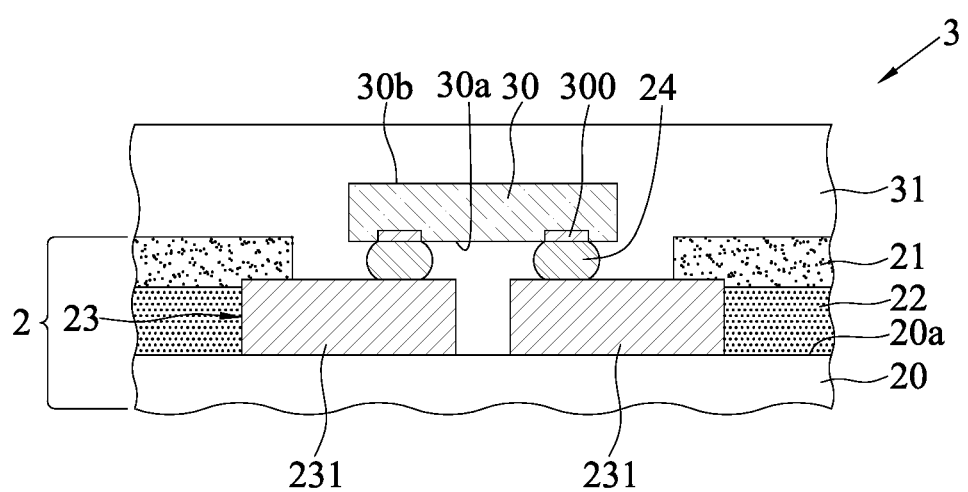
FIG. 3 is a schematic cross-sectional view showing an electronic package of the present disclosure.

An outer surface of the substrate body 20 is defined as a packaging surface 20a for the packaging operation of an electronic component 30 (as shown in FIG. 3).

In an embodiment, the substrate body 20 is a circuit structure with a core layer or a coreless circuit structure, such as a packaging substrate, and the substrate body 20 comprises a dielectric layer and a routing layer (e.g., a wiring layer) formed on the dielectric layer. For instance, the routing layer is formed in the form of a redistribution layer (RDL), and the material for forming the dielectric layer is a dielectric material such as polybenzoxazole (PBO), polyimide (PI), prepreg (PP), and the like. It should be understood that the substrate body 20 can also be other carrying units for carrying/connecting the electronic component 30, such as a wafer, a chip, a silicon interposer, silicon material, glass, and other semiconductor materials, but not limited to as such.

The circuit layer 23 is formed on the packaging surface 20a of the substrate body 20, and the circuit layer 23 is electrically connected to the routing layer of the substrate body 20.

Figure 2B:
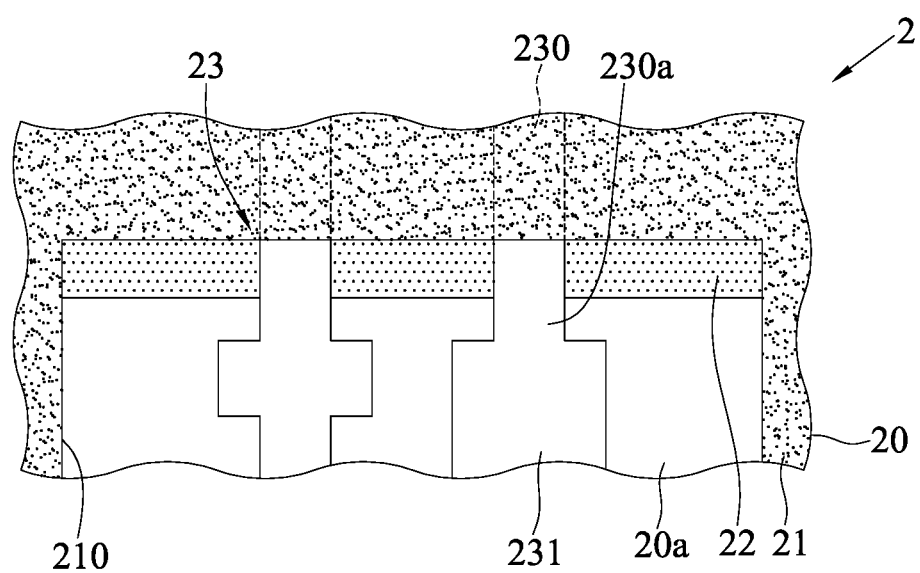
FIG. 2B is a schematic partial top plan view showing the substrate structure of the present disclosure.

In an embodiment, as shown in FIG. 2B, the circuit layer 23 comprises a plurality of conductive traces 230 and a plurality of electrical contact pads 231 integrated with the plurality of conductive traces 230, and the conductive traces 230 are separated from each other without short-circuiting. The electrical contact pads 231 are bonded to conductive components 24 (as shown in FIG. 3) such as solder material, such that the substrate structure 2 is connected to the electronic component 30 such as a chip, a packaging substrate, or a packaging module via the conductive components 24.

The filling layer 22 is formed on the packaging surface 20a of the substrate body 20 and is located between the conductive traces 230 without covering the circuit layer 23, wherein a portion of the packaging surface 20a is exposed from the filling layer 22 (the filling layer 22 merely covers a portion of the packaging surface 20a).

In an embodiment, the filling layer 22 is a photosensitive solder-mask layer made of such as green paint and is adjacent to each of the conductive traces 230.

Figure 2C:
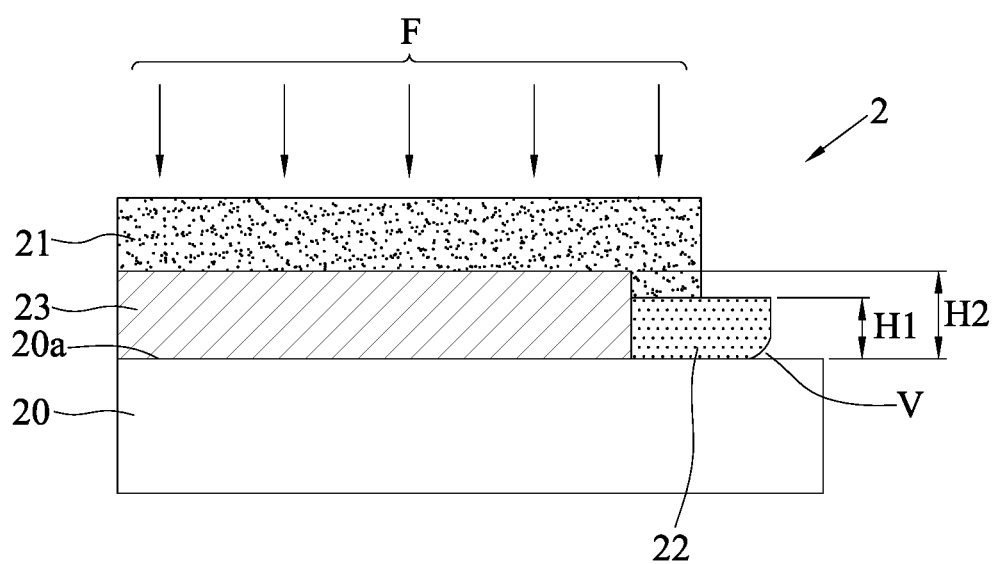
FIG. 2C is a partial cross-sectional view showing the substrate structure of the present disclosure.

Moreover, as shown in FIG. 2C, a thickness H1 of the filling layer 22 is less than or equal to a thickness H2 of the circuit layer 23, so that the circuit layer 23 protrudes from or is flush with the filling layer 22.

The insulating protective layer 21 is formed on a portion of a surface of the filling layer 22 and a portion of a surface of the circuit layer 23, and the insulating protective layer 21 has at least one opening 210, as shown in FIG. 2B, such that a portion of the packaging surface 20a of the substrate body 20, portions of line sections 230a of the plurality of conductive traces 230, and the plurality of electrical contact pads 231 are exposed from the opening 210, so the insulating protective layer 21 merely covers a portion of the circuit layer 23.

In an embodiment, the insulating protective layer 21 is a photosensitive solder-mask layer made of such as green paint, and the wall of the opening 210 of the insulating protective layer 21 and the top of the filling layer 22 form a step-shaped structure T (e.g., the step-shaped structure T is formed between the wall of the opening 210 of the insulating protective layer 21 and the top of the filling layer 22). For instance, the opening 210 is formed by exposure and development. It should be understood that there are various materials of the photosensitive solder-mask layer, thus the material of the filling layer 22 and the material of the insulating protective layer 21 can be the same or different.

In the subsequent application, as shown in FIG. 3, the plurality of conductive components 24 are formed on the plurality of electrical contact pads 231 in the opening 210, such that the substrate structure 2 is connected to the electronic component 30 via the plurality of conductive components 24, and the electronic component 30 is covered by an encapsulation layer 31, thereby forming an electronic package 3.

The electronic component 30 is an active element, a passive element, or a combination of the active element and the passive element, wherein the active element is such as a semiconductor chip, and the passive element is such as a resistor, a capacitor, or an inductor.

In an embodiment, the electronic component 30 is a semiconductor chip and has an active surface 30a and an inactive surface 30b opposing the active surface 30a, and a plurality of electrode pads 300 are formed on the active surface 30a, so that the electronic component 30 is electrically connected to the circuit layer 23 with the electrode pads 300 thereof in a flip-chip manner (via the plurality of conductive components 24), and then the plurality of conductive components 24 are covered by an underfill (not shown) or the encapsulation layer 31. However, the way in which the electronic component 30 is electrically connected to the circuit layer 23 is not limited to the above.

The encapsulation layer 31 is made of an insulating material, such as polyimide (PI), dry film, epoxy resin, epoxy colloid, or molding compound, and the encapsulation layer 31 can be formed on the packaging surface 20a of the substrate structure 2 by lamination or molding. In an embodiment, the filling layer 22 can be firstly formed between the conductive traces 230 (the circuit layer 23 is not covered by the filling layer 22), and then the filling layer 22 is patterned to expose the portion of the circuit layer 23 to be exposed, and the encapsulation layer 31 is formed afterward.

Therefore, in the substrate structure of the present disclosure, the filling layer 22 is filled in the gap of the circuit layer 23 and carries the insulating protective layer 21, so that a thickness R of the insulating protective layer 21 can be thin. Hence, compared to the prior art, during the exposure and development operation, the light energy F (as shown in FIG. 2C) will take the packaging surface 20a of the substrate body 20 as the reference, so that the light energy F will directly act on the packaging surface 20a of the substrate body 20, such that the bottom of the insulating protective layer 21 having the thin thickness R can sufficiently absorb the light energy F. Therefore, an undercut structure will not be formed at the bottom of the wall of the opening 210 after the development operation since the bottom of the opening 210 is sufficiently illuminated, such that the phenomenon of copper migration can be avoided and the reliability can be improved.

Furthermore, when the filling layer 22 is a photosensitive solder-mask layer, even if an undercut structure V (as shown in FIG. 2C) might be formed at the bottom of the filling layer 22, due to that the thickness H1 of the filling layer 22 is less than or equal to the thickness H2 of the circuit layer 23, the underfill or the encapsulation layer can be filled into the undercut structure V in the subsequent packaging stage, so as to avoid the phenomenon of copper migration, thereby the substrate structure 2 has good reliability and short circuit can also be prevented from occurring between two adjacent ones of the conductive traces 230.

Moreover, since the thickness R of the insulating protective layer 21 is extremely thin, the light energy F is not required to be set too large. Therefore, compared to the prior art, even if the light energy F is set to a strength that an undercut structure will not be formed at the bottom of the insulating protective layer 21, the material of the insulating protective layer 21 at the opening 210 will not be overexposed, thereby ensuring that the required metal areas (i.e., portions of the line sections 230a of the plurality of conductive traces 230 and the electrical contact pads 231) of the circuit layer 23 are effectively exposed.

Additionally, the substrate structure 2 can be manufactured by using existing materials, equipment and manufacturing process, thus there is no need to use special manufacturing process or new manufacturing process and materials, so there is no need to purchase new equipment. Therefore, the manufacturing method of the present disclosure can effectively reduce the manufacturing cost to facilitate mass production.

To sum up, in the electronic package and the substrate structure thereof of the present disclosure, the design of the filling layer allows the insulating protective layer to be thin. Therefore, the phenomenon of copper migration can be effectively prevented from occurring to the substrate structure of the present disclosure, so there is no short circuit between the adjacent conductive traces, thereby improving the reliability of the electronic package and the substrate structure thereof of the present disclosure.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A substrate structure, comprising:
a substrate body having a packaging surface;
a circuit layer formed on the packaging surface, wherein the circuit layer comprises a plurality of conductive traces and a plurality of electrical contact pads bonded to the plurality of conductive traces, and the plurality of conductive traces are separated from each other;
an insulating filling layer formed on the packaging surface and disposed between the plurality of conductive traces, wherein a top surface of the circuit layer is free from being covered by the insulating filling layer; and
an insulating protective layer formed to cover a top surface of a first portion of the insulating filling layer and a first portion of the top surface of the circuit layer, wherein the insulating protective layer has at least one opening exposing the plurality of electrical contact pads and a second portion of the insulating filling layer, wherein a wall of the at least one opening of the insulating protective layer and a top surface of the second portion of the insulating filling layer form a step-shaped structure,
wherein the insulating filing layer does not overlap with the circuit layer in a plan view above the substrate surface, and
wherein the plurality electrical contact pads include sidewalls exposed by the second portion of the insulating filling layer.

2. The substrate structure of claim 1, wherein the insulating filling layer is adjacent to the plurality of conductive traces.

3. The substrate structure of claim 1, wherein the insulating filling layer has a thickness less than or equal to a thickness of the circuit layer.

4. The substrate structure of claim 1, wherein a portion of the packaging surface of the substrate body, portions of line sections of the plurality of conductive traces, and the plurality of electrical contact pads are exposed from the at least one opening.

5. The substrate structure of claim 1, wherein a material of the insulating filling layer and a material of the insulating protective layer are the same.

6. The substrate structure of claim 1, wherein a material of the insulating filling layer and a material of the insulating protective layer are different.

7. An electronic package, comprising:
   the substrate structure of any one of claims 1 to 4, 5 and 6; and
   an electronic component disposed on the packaging surface and electrically connected to the circuit layer.

8. The electronic package of claim 7, further comprising a plurality of conductive components formed on the plurality of electrical contact pads in the opening, wherein the substrate structure is connected to the electronic component via the plurality of conductive components.

9. The electronic package of claim 7, further comprising an encapsulation layer covering the electronic component.

* * * * *